US006230790B1

(12) United States Patent
Hemingway et al.

(10) Patent No.: US 6,230,790 B1
(45) Date of Patent: May 15, 2001

(54) THERMAL CONTROL SYSTEM FOR SPACECRAFT

(75) Inventors: Michael D. Hemingway, Littleton; Glen W. Hicks, Sedalia; Dwight E. Hull, III; Michael D. Ritchie, both of Littleton, all of CO (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/309,004

(22) Filed: May 10, 1999

(51) Int. Cl.[7] .............................. F28F 7/00; F28F 27/00; F28D 15/00
(52) U.S. Cl. ................................. 165/80.4; 165/104.33; 165/274
(58) Field of Search .................. 165/80.4, 80.3, 165/273, 274, 104.33; 361/700; 219/209

(56) References Cited

U.S. PATENT DOCUMENTS

| | | | |
|---|---|---|---|
| 3,749,156 | 7/1973 | Fletcher et al. | 165/32 |
| 4,099,556 * | 7/1978 | Roberts, Sr. | 165/96 |
| 4,133,376 * | 1/1979 | Eilenberg et al. | 165/104.21 |
| 4,162,701 * | 7/1979 | Ollendorf | 165/32 |
| 4,388,964 | 6/1983 | Almgren et al. | 165/32 |
| 4,420,035 | 12/1983 | Hewitt | 165/32 |
| 4,602,679 | 7/1986 | Edelstein et al. | 165/104.26 |
| 4,685,512 | 8/1987 | Edelstein et al. | 165/104.14 |
| 4,830,097 | 5/1989 | Tanzer | 165/41 |
| 4,871,012 | 10/1989 | Kuo | 165/41 |
| 4,880,050 | 11/1989 | Nakamura et al. | 165/41 |
| 5,036,905 | 8/1991 | Eninger et al. | 165/41 |
| 5,103,897 | 4/1992 | Cullimore et al. | 165/32 |
| 5,111,874 | 5/1992 | Kosson | 165/32 |
| 5,271,454 | 12/1993 | Leidinger | 165/41 |
| 5,289,869 | 3/1994 | Klein et al. | 165/32 |
| 5,293,171 * | 3/1994 | Cherrette | 343/700 MS |
| 5,332,030 | 7/1994 | Spencer et al. | 165/32 |
| 5,351,746 | 10/1994 | Mackey et al. | 165/41 |
| 5,372,183 | 12/1994 | Strickberger | 165/41 |
| 5,474,262 | 12/1995 | Fiore | 244/158 |
| 5,506,032 | 4/1996 | Rowe | 428/178 |
| 5,624,088 | 4/1997 | Fiore | 244/158 |
| 5,682,943 * | 11/1997 | Yao et al. | 165/104.33 |
| 5,699,982 * | 12/1997 | Daugherty | 244/63 |
| 5,727,619 | 3/1998 | Yao et al. | 165/104.33 |
| 5,730,211 | 3/1998 | Conway | 165/104.14 |
| 5,806,803 | 9/1998 | Watts | 244/163 |
| 5,823,477 | 10/1998 | York | 244/163 |
| 5,844,208 * | 12/1998 | Tustaniwskyj et al. | 219/494 |
| 5,896,259 * | 4/1999 | Farwell et al. | 361/78 |
| 5,969,940 * | 10/1999 | Sano et al. | 361/687 |
| 6,003,591 * | 12/1999 | Campbell | 165/185 |

* cited by examiner

*Primary Examiner*—Ira S. Lazarus
*Assistant Examiner*—Tho Duong
(74) *Attorney, Agent, or Firm*—Marsh Fischmann & Breyfogle LLP (57) ABSTRACT

A thermal control system for use in a mobile craft is disclosed. The thermal control system generally includes a structure for supporting one or more heat sources, such as electronic equipment and at least a first heat pipe contained within the structure, the first heat pipe being capable of transferring heat energy from the heat source(s) toward an outboard surface of the structure and/or inhibiting such transfer of heat energy to the outboard surface of the structure, in order to maintain the heat source(s) substantially at room temperatures during operation of such electronics equipment.

31 Claims, 7 Drawing Sheets

THERMAL CONTROL SYSTEM FOR SPACECRAFT

FIELD OF THE INVENTION

The present invention generally relates to thermal control systems and, in particular, relates to a thermal control system for use in controlling the temperature of heat sources on spacecraft.

BACKGROUND OF THE INVENTION

Generally, conventional thermal control systems are designed primarily to remove or dissipate heat energy generated by electronic equipment mounted on structural panels. In some cases, such systems utilize structural panels on the exterior walls of a spacecraft or aircraft, such that heat energy is transferred through the thickness of the structural panel and then radiated into the surrounding environment. In order to cool electronic equipment, large, efficient radiative surfaces of structural panels are typically utilized. Another conventional way to cool electronic equipment includes providing constant conductance heat pipes which function as liquid coolant flow passages to increase the structural panel's heat transport capability. However, and as noted in U.S. Pat. No. 5,506,032, the additional weight of a more massive structural panel or of liquid cooling systems are not tolerable or desirable in some applications.

In addition, and in spite of the primary focus of such conventional thermal control systems to dissipate heat energy, electronic equipment performance can be degraded during high duty-cycle periods if sufficient amounts of heat energy cannot be dissipated. In other instances, where electronic equipment is operating at low duty-cycles, conventional thermal control systems for dissipating heat energy from electronic equipment are not desirable since the performance of such electronic equipment can degrade when operating at cooler temperatures (e.g., less than 10 degrees Celsius). Finally, without larger heater power, conventional thermal control systems are not typically capable of preserving the functionality of electronic equipment (e.g, at less than −20degrees Celsius and when the electronic equipment is powered off).

SUMMARY OF THE INVENTION

Accordingly, it is an object of the present invention to provide a system and method for controlling the temperature of heat sources (e.g. electronic equipment) on mobile craft, such as spacecraft or in ground-based stationary structures.

It is another object of the present invention to provide a system and method for maintaining the temperature of heat sources aboard a spacecraft within a desirable range of operating temperatures to enhance performance of such heat sources.

It is still another object of the present invention to provide a system and method for regulating the temperature of heat sources to preserve the functionality of such heat sources in extreme environments.

In one aspect, the present invention is embodied in a thermal control system for use in regulating the temperature of at least a first heat source (e.g. an electronic equipment) of a spacecraft. Generally, the thermal control system may include a structure for supporting at least the first heat source, the first heat source being interconnectable to the structure, and at least a first heat pipe associated with the structure, the first heat pipe being capable of transferring heat energy of at least the first heat source from the first heat source, proximate a first surface (e.g., inboard surface) of the structure, toward a second surface (e.g., outboard surface) of the structure and/or inhibiting or limiting such transfer of heat energy of at least the first heat source toward the second surface of the structure. The first heat pipe may include first and second end portions (e.g., inboard and outboard end portions), the first end portion being positionable and/or thermally couplable to the first surface of the structure and/or to at least the first heat source, and the second end portion of the first heat pipe being positionable and/or thermally couplable to the second surface of the structure and/or a second heat pipe which is thermally couplable to the second end portion of the first heat pipe. Of importance, at least the first heat pipe of the system of the present invention is embeddable within the structure of the present invention, and includes an intermediate portion extending between the first and second end portions. Such intermediate portion of the first heat pipe may be angled relative to the first and second surfaces of the structure to provide the capability to transfer heat energy directly from the first surface of the structure and/or the first heat source to the second surface of the structure and/or to the second heat pipe, through the interior of the structure, and to inhibit such transfer of heat energy, depending upon the environment and duty-cycle of the first heat source. By virtue of this compact packaging arrangement, the thermal control system of the present invention may function to regulate the temperature of at least the first heat source by at least dissipating heat energy from at least the first heat source and/or minimizing the transfer of heat energy from the first heat source to the second surface of the structure and/or to the second heat pipe.

Specifically, in one embodiment, the first heat pipe comprises a first variable conductance heat pipe having a first reservoir and a first reservoir heater which is thermally couplable to the first reservoir to heat a non-condensible gas contained within the first reservoir. In a first mode of operation of the thermal control system of the present invention, in instances where at least the first heat source is operating, it may be desirable to dissipate heat energy from at least the first heat source via the first variable conductance heat pipe to keep at least the first heat source within a desirable range of operating temperatures to thereby optimize performance of at least the first heat source. In this first mode of operation, the first reservoir heater may be deactivated or turned "off", which allows heat energy to be transferred from the first end portion to the second end portion of the first variable conductance heat pipe and thus to the second heat pipe thermally couplable thereto and/or the second surface of the structure to dissipate heat energy from at least the first heat source. In this first mode of operation, the first variable conductance heat pipe functions as a constant conductance heat pipe to transfer heat energy through the interior of the structure. In a second mode of operation of the thermal control system of the present invention, it may be desirable to inhibit the transfer of heat energy from the first heat source in order to maintain at least the first heat source within a desirable range of temperatures to thereby optimize performance of at least the first heat source and/or to preserve the functionality of at least the first heat source. In this second mode of operation, dissipation of heat energy from the first heat source to the environment via first variable conductance heat pipe may be minimized by activating or turning "on" at least the first reservoir heater to heat the non-condensible gas contained within the first reservoir, which functions to inhibit the transfer of heat energy from the first heat source to the second surface of the structure.

In another aspect, the system of the present invention is directed to controlling or regulating the temperature of at least a first heat source (e.g., an electronic equipment) in at least one of three modes of operation or states of operation. Generally, the three operational states function to substantially maintain the electronic equipment temperature within a desirable range(s). In particular, the system may be designed to maintain the temperature of at least the first heat source at or near room temperatures (e.g., within 10° Celsius to 40° Celsius). In other instances, the system may function to keep the temperature of electronic equipment within certain limits (e.g., within −24° C. to 61° C.) to preserve the functionality of the electronic equipment in extreme environments. Of course, the system may function to maintain and/or preserve the temperature of at least the first heat source within other temperature ranges depending upon the requirements of the heat source, the performance limits of the working fluid (e.g. ammonia, water, propane, etc.) within the heat pipe, the structure (e.g., NOMEX® honeycomb, fiberglass, foam, graphite epoxy, etc.), and the settings of the temperature sensors (to be described in more detail hereinbelow). Such functionality may be accomplished autonomously, which is especially useful in spacecraft applications. Generally, the thermal control system may include at least a first heat pipe having first and second end portions positionable proximate the first and second surfaces of a structure having a relatively low through-the-thickness heat transfer coefficient (e.g. conductive, radiative), the first and second end portions being parallel and/or non-coplanar, and at least a first temperature sensor thermally couplable to at least the first heat pipe for monitoring the temperature of the first end portion of the first heat pipe and, inferentially, the electronic equipment interconnected to the first surface of the structure. In one embodiment, at least the first heat pipe is embeddable within the structure and comprises a first variable conductance heat pipe. More specifically, the first temperature sensor (e.g., thermostat, thermistor in communication with a processor, etc.) may be thermally coupled to one of an inboard end portion of the first variable conductance heat pipe. The first variable conductance heat pipe includes a first reservoir for containing non-condensible gas and a first reservoir heater for heating the non-condensible gas in certain operating conditions. In this regard, the first temperature sensor is also adapted to activate or deactivate the first reservoir heater, depending upon the temperature sensed by the first temperature sensor. For example, in the first mode of operation, the first temperature sensor may be adapted to open at a pre-defined temperature, such that in an open state corresponding to a higher than desirable operating temperature, the first reservoir heater is not activated, which allows heat energy to be transferred away from at least the first heat source, from at least the inboard end portion to the outboard end portion of at least the first variable conductance heat pipe to dissipate heat from at least the first heat source mounted on the first surface of the structure. In a second mode of operation, where the first temperature sensor is in a closed state corresponding to a lower than desired operating temperature, at least the first reservoir heater of at least the first variable conductance heat pipe is activated to provide heat energy to the corresponding first reservoir to thereby expand the non-condensible gas therein to restrict the transfer of heat energy towards the second end portion of the first variable conductance heat pipe, even in instances where the first heat source is operating. The system may further include at least a first supplemental heater thermally couplable to the inboard end portion of the first heat pipe or a second heat pipe which extends between the first supplemental heater and the first heat source. The first supplemental heater functions to provide heat energy to at least one of the first heat source and a second heat source in extreme cold conditions and/or when the heat source is not operating, such first supplemental heater being activatable by at least the first temperature sensor in a third mode of operation of the system. In this third mode of operation, in order to limit dissipation of heat energy from at least the first heat source to thereby keep the temperature of at least the first heat source within acceptable functional limits in extreme cold conditions and/or when the first heat source is not operating, the first temperature sensor may activate at least the first reservoir heater to expand the noncondensible gas contained within the first reservoir to thereby restrict the transfer of heat energy from the first supplemental heater towards the outboard end portion of the first variable conductance heat pipe. Autonomous operation of the thermal control system of the present invention may be achieved by supplying power to circuits associated with at least the first temperature sensor, first reservoir heater and the first supplemental heater.

Additionally, in at least the second and third modes of operation, where it is desirable to limit dissipation of heat energy, the structure of the system of the present invention may be configured/constructed to have insulative characteristics. More specifically, in one embodiment, in order to limit dissipation of heat energy from the first surface to the second surface of the structure (e.g., through the thickness of the structure), the structure may be of a honeycomb, Nomex, foam, fiberglass, or graphite epoxy construction, and additionally constructed/configured to limit at least one of conductive and radiative heat energy transfer from at least the first surface to the second surface of the honeycomb structure. In one embodiment, the honeycomb structure includes at least a first honeycomb core, which is insulative in nature. In another embodiment, the honeycomb structure includes at least first and second honeycomb cores each having a low thermal conductivity, and at least a first separator sheet (e.g. aluminum) interposed therebetween for limiting radiative heat transfer.

In another aspect, the present invention is directed to a method for controlling the temperature of heat sources (e.g. electronic equipment) interconnected to a structure of a spacecraft. Generally, the purpose of the method is to maintain the temperature of the heat sources within a desired range (e.g., room temperatures) to optimize performance of such heat sources and/or to preserve functionality of such heat sources in extreme environments by maintaining such heat sources within their functional limitations. Such heat sources may be interconnected to a first surface of a structure.

Specifically, the method may include the steps of monitoring the temperature of the heat source and maintaining the temperature of the heat source within an acceptable range of operating temperatures and/or within a range of temperatures corresponding to preserving the functionality of the heat source, which is especially critical when the spacecraft is in extreme environments and the heat source is not operating. In particular, the step of maintaining may include the steps of either transferring heat energy away from such heat source in a first mode of operation or, in a second mode of operation, inhibiting the transfer of heat energy from the heat source. In one embodiment, the step of transferring heat energy away from the heat source towards a second surface of the structure in the first mode of operation in order to keep the temperature of the heat source within the desired range (e.g. substantially at room temperatures) may occur when the heat source is generating heat (e.g., operating) or has a temperature greater than a first temperature. The step of inhibiting the transfer of heat energy from the heat source to a second surface of the structure in a second mode of operation to keep the temperature of the heat source within the desired range (e.g. substantially at room temperatures) may occur when the heat source is in operation or not in operation or at or below a second temperature less than or equal to the first temperature. Such functionality may be accomplished by using at least a first thermostat or thermistor for at least sensing the temperature of such heat sources and at least a first variable conductance heat pipe having first and second end portions thermally couplable to the first and second surfaces of the structure, the first variable conductance heat pipe being embeddable within the structure and in electrical communication with at least the first temperature sensor for activation thereby.

DETAILED DESCRIPTION

FIGS. 1–9 illustrate the various features and embodiments of the present invention. Generally, the system and method of the present invention are directed to controlling or regulating the temperature of one or more heat sources (e.g., electronic equipment) interconnected to a spacecraft, such as a space-based vehicle. More specifically, the system and method of the present invention function to control the temperature of electronic equipment so that performance of such electronic equipment is optimal, and, in other cases, function to control the temperature of electronic equipment to preserve the functionality and/or operability of such electronic equipment in extreme environments. In this regard, the system and method of the present invention is directed to maintaining temperatures of electronic equipment within a desirable range of temperatures (e.g., room temperatures) throughout all operating environments and to ensure that the electronic equipment temperatures will not drop below acceptable limits (e.g., less than −20 degrees Celsius) when such electronic equipment is in an extremely cold environment and not operating.

In one embodiment of the system of the present invention, illustrated in FIGS. 1–7, for purposes of maintaining the temperature of electronic equipment substantially at room temperatures during high and/or low duty-cycles of the electronic equipment, the thermal control system 10 includes a panel or structure 14 for supporting one or more heat sources 18 (e.g., electronic equipment) and a plurality of variable conductance heat pipes 22 which are contained/ embedded within the structure 14. Each of the variable conductance heat pipes 22 is adapted to at least transfer heat energy generated by the heat sources 18 away from the heat sources 18, the heat sources 18 being interconnected to the top surface 26 or facesheet 30 (e.g., inboard surface or facesheet) of the structure 14, toward the bottom surface 28 or facesheet 32 (e.g., outboard surface or facesheet) of the structure 14 where such transferred heat energy is radiatable to the environment (e.g., space) in a first mode of operation of the system 10. In this first mode of operation, the electronic equipment 18 is typically operating at high duty-cycles. In a second mode of operation of the system 10, which is primarily useful when the electronic equipment 18 is operating in low duty-cycles, the same plurality of variable conductance heat pipes 22 function to inhibit or limit the transfer of heat energy from the heat sources 18 interconnected to the top surface 26 of the structure 14 towards the bottom surface 28 of the structure 14. For purposes of determining whether the plurality of variable conductance heat pipes 22 should transfer heat energy away from the heat sources 18 or inhibit such transfer of such heat energy in the first and second modes of operation, the system 10 further includes a plurality of temperature sensors 34 which are interconnected to the top surface 26 of the structure 14 and which are in electrical communication with the variable conductance heat pipes 22. The temperature sensors 34 function to monitor the temperature of the heat sources 18, and, depending upon the temperatures being sensed, function to direct the variable conductance heat pipes 22 to transfer or inhibit the transfer of heat energy from the top surface 26 towards the bottom surface 28 of the structure 14 (as will be described in more detail hereinbelow).

More specifically, and as shown in FIGS. 1–7, the thermal control system 10 of the present invention includes a honeycomb structure 14 for supporting a plurality of heat generating electronics equipment 18 (e.g., heat sources) on the inboard surface 26 of the honeycomb structure 14, a plurality of variable conductance heat pipes 22 having first and second (e.g., inboard and outboard) end portions 23a, 23b located proximate and thermally coupled to the inboard and outboard surfaces 26, 28 of the honeycomb structure 14 and intermediate portions 24 extending between the end portions 23a, 23b, and first and second pluralities of constant conductance heat pipes 38, 42 which are thermally coupled to the inboard and outboard surfaces 26, 28 of the honeycomb structure 14, respectively.

For purposes of enhancing efficiency for the transfer of heat energy to and/or from the electronic equipment 18, the first or inboard end portions 23a of the variable conductance heat pipes 22 and the first plurality of constant conductance heat pipes 38 are positionable beneath and thermally coupled to the various electronic equipment 18 (e.g., beneath the thermal footprints of such electronic equipment 18). In this regard, the first plurality of constant conductance heat pipes 38 are thermally coupled to a first portion of the electronic equipment 18 while the inboard end portions 23a of the variable conductance heat pipes 22 are thermally coupled to a second portion of the electronic equipment 18. Of course, some of the electronic equipment 18, especially those operating at high watt densities, may be thermally coupled to one or more inboard end portions 23a of the variable conductance heat pipes 22 and/or one or more of the first plurality of constant conductance heat pipes 38 in order to at least enhance the transfer of heat energy away from such electronic equipment 18. And in order to provide an isothermal structure, whereby the electronic equipment 18 is operating substantially at room temperatures (e.g., about 10° Celsius to about 40° Celsius), at least some of the inboard end portions 23a of the variable conductance heat pipes 22 are thermally coupled to the first plurality of constant conductance heat pipes 38. The first plurality of constant conductance heat pipes 38 also function to transfer heat energy from various electronic equipment 18 to the first or inboard end portions 23a of the variable conductance heat pipes 22 which are thermally coupled to the first plurality of constant conductance heat pipes 38 via a thermally conductive adhesive. The second plurality of constant conductance heat pipes 42, which are also embedded in the honeycomb structure 14, proximate the second or outboard surface 28 of the honeycomb structure 14, are thermally coupled to the second end portions 23b of the variable conductance heat pipes 22 via a thermally conductive adhesive (e.g. EF9025 from Cytec Industries, Inc.) to allow the transfer of heat energy from the variable conductance heat pipes 22 to the outboard surface 28 of the honeycomb structure 14, to thereby allow the heat energy to be radiated from the outboard facesheet 32 to the environment. For purposes of at least radiatively transferring heat energy into the environment in the first mode of operation of the system, the second plurality of constant conductance heat pipes 42 are thermally coupled to the outboard facesheet 32 of the structure 14 via a thermally conductive adhesive.

Of importance, in order to maintain the operating temperatures of the electronic equipment 18 substantially at room temperatures by transferring heat energy from the inboard surface 26 to the outboard surface 28 of the structure 14 in the first mode of operation and by inhibiting such heat energy transfer in the second mode of operation within a compact arrangement, each of the variable conductance heat pipes 22 includes an intermediate portion 24 which is angled relative to the inboard and outboard facesheets 30, 32 of the honeycomb structure 14. In this regard, the inboard and outboard end portions 23a, 23b (e.g., first and second end portions) of the variable conductance heat pipes 22 are in first and second planes (e.g., non-coplanar). In order to provide such non-coplanar end portions 23a, 23b of the variable conductance heat pipes 22, each of the variable conductance heat pipes 22 includes first and second bend portions 25a, 25b between the intermediate portions 24 and the inboard and outboard end portions 23a, 23b, whereby the inboard and outboard end portions 23a, 23b of the variable conductance heat pipes 22 are generally parallel to and thermally coupled to the inboard and outboard facesheets 30, 32 of the structure 14. In one embodiment, for purposes of providing such orientation of the intermediate portion 24 relative to the inboard and outboard facesheets 30, 32 while preserving the functionality of the variable conductance heat pipes 22 to sufficiently transfer heat energy from the inboard end portions 23a to the outboard end portions 23b, the minimum bend radius of the first and second bend portions 25a, 25b for the variable conductance heat pipes 22 of the present invention is at least about 3 inches in one embodiment, and between about 3 inches and about 6 inches in another embodiment. The minimum bend radius generally corresponds to about ten times the diameter or height of the variable heat conductance pipe. In another embodiment, the first end portion is oriented between about 1° and 180° relative to the second end portion. Conventional bending techniques may be used to provide the first and second bend portions 25a, 25b of the variable conductance heat pipes 22, which are typically available from various vendors, such as Dynatherm, in a straight state.

Figure 1:
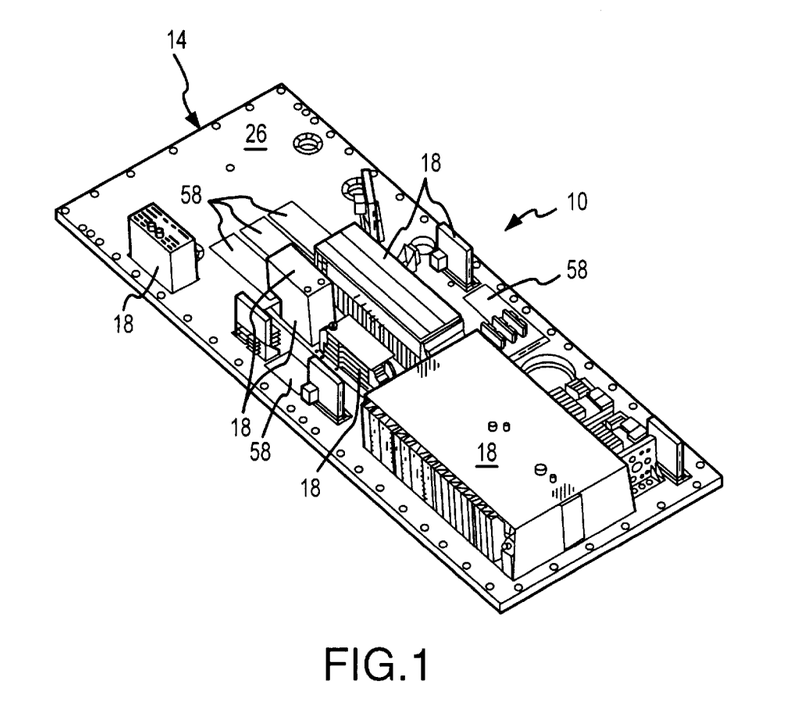
FIG. 1 is a perspective view of one embodiment of the system of the present invention with a plurality of electronic equipment mounted thereon.
Figure 2:
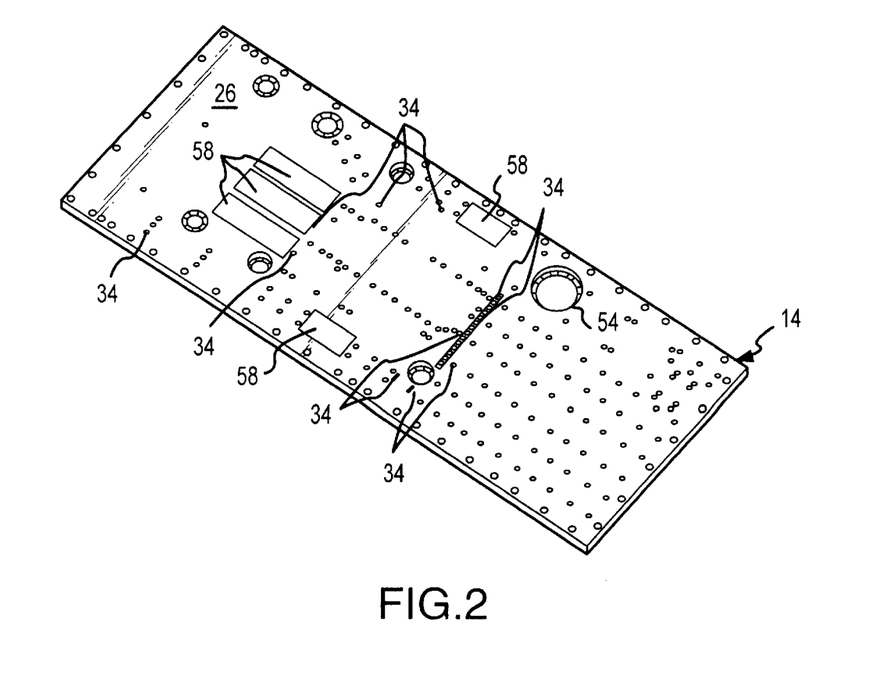
FIG. 2 is a perspective view of the system illustrated in FIG. 1 without the plurality of electronic equipment mounted thereon.
Figure 3:
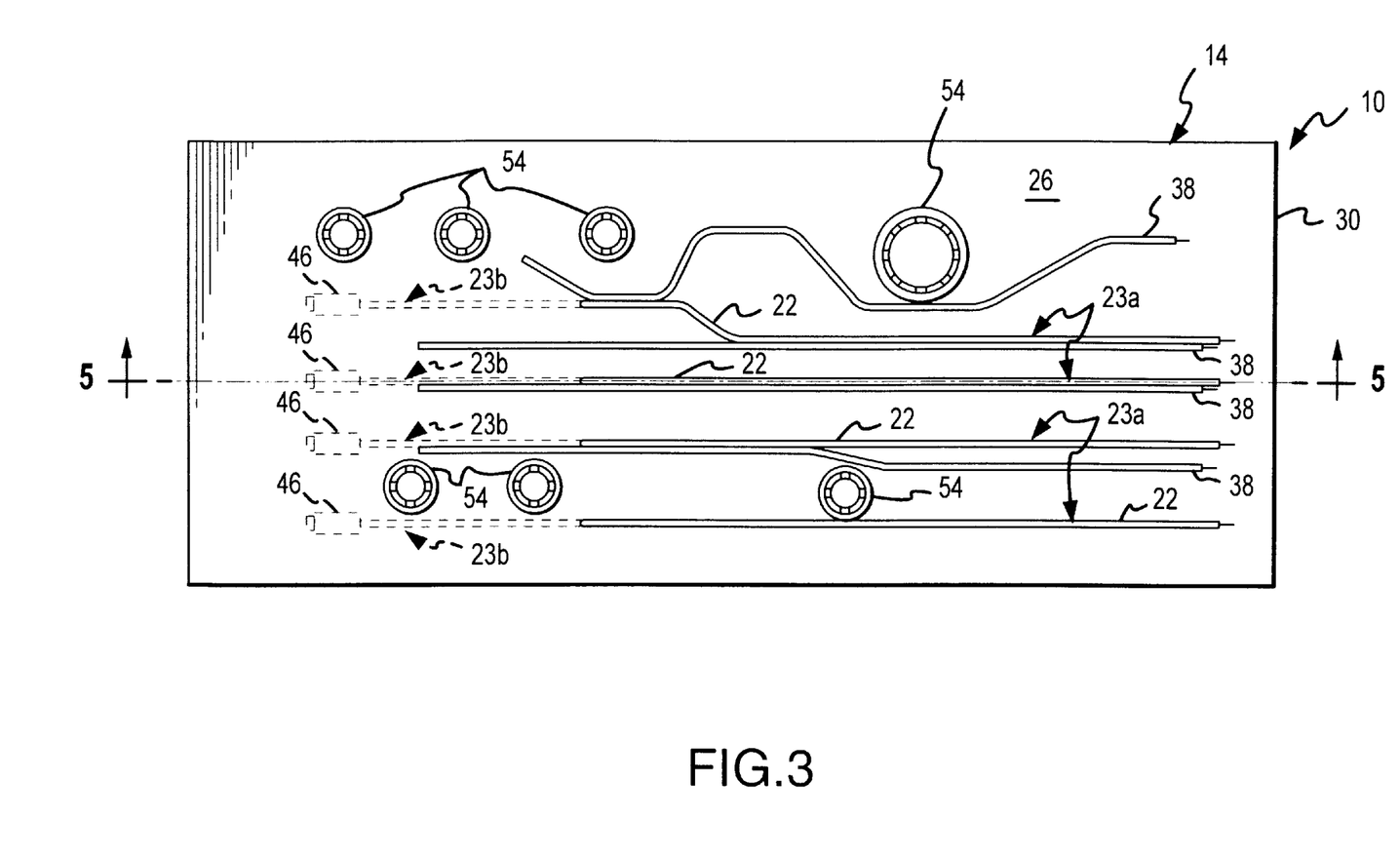
FIG. 3 is a top plan view of the system illustrated in FIG. 1 with the top facesheet of the structure removed.
Figure 4:
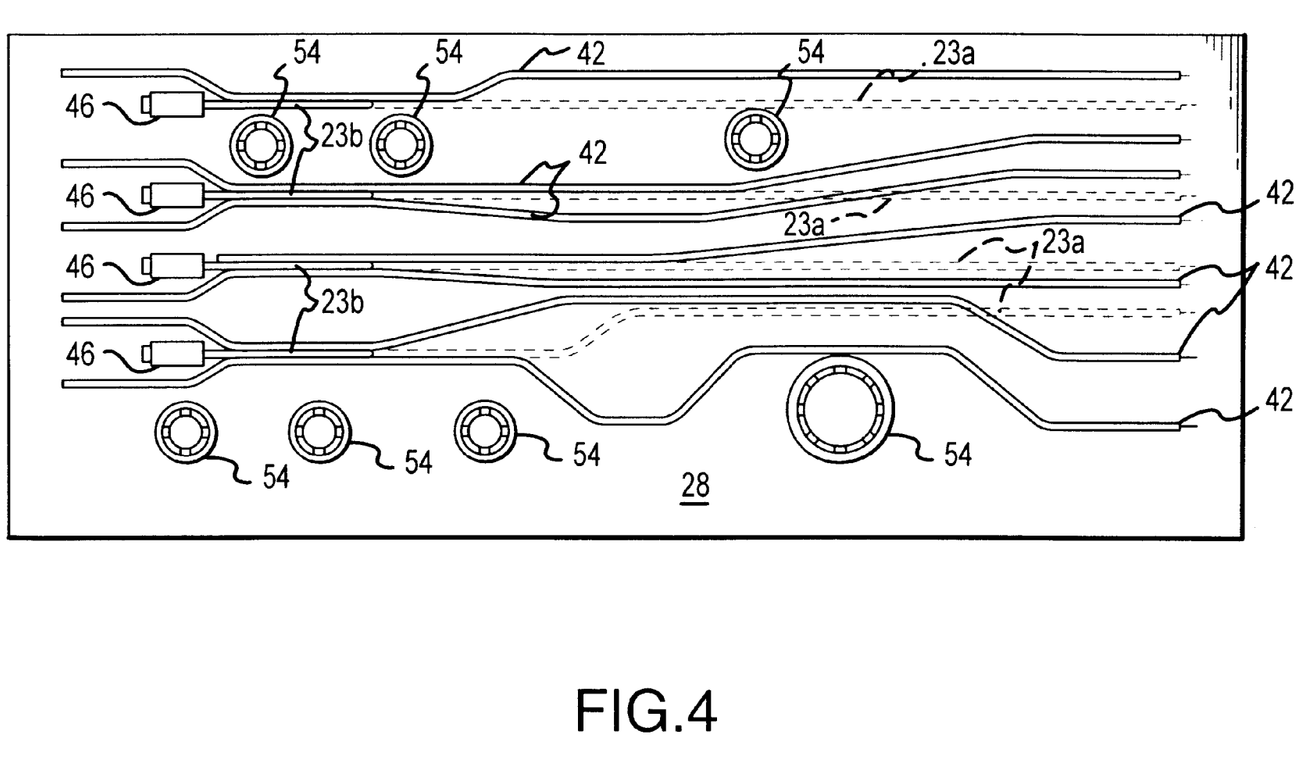
FIG. 4 is a bottom plan view of the system illustrated in FIG. 1 with the bottom facesheet removed.
Figure 5:
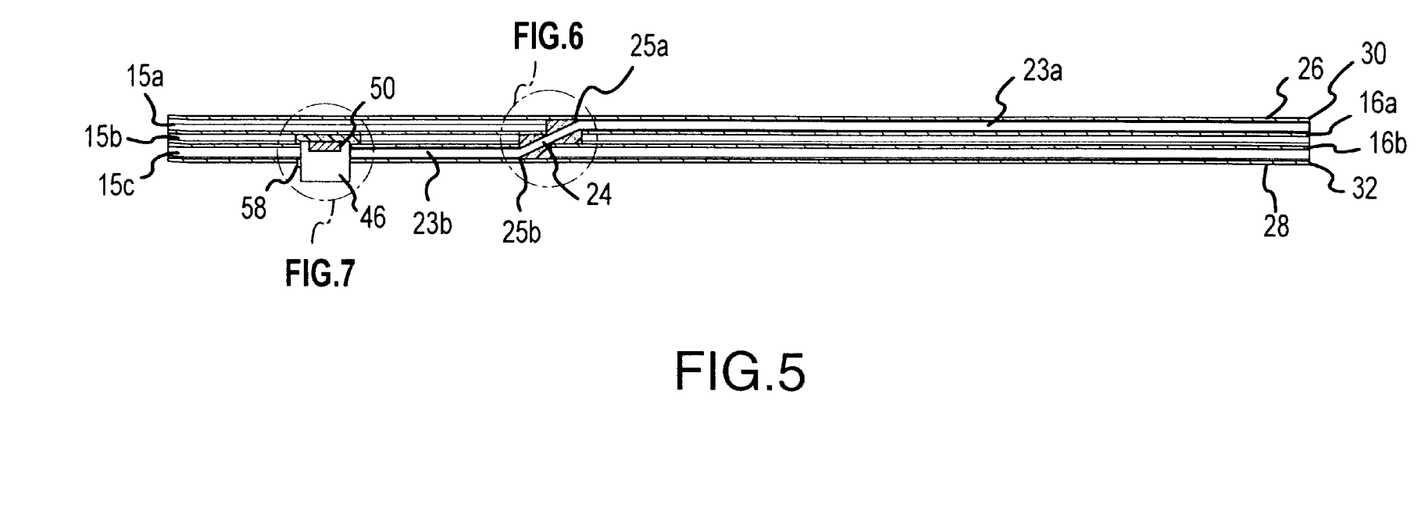
FIG. 5 is a cross-sectional view of the system illustrated in FIG. 3 taken along lines 5—5.
Figure 6:
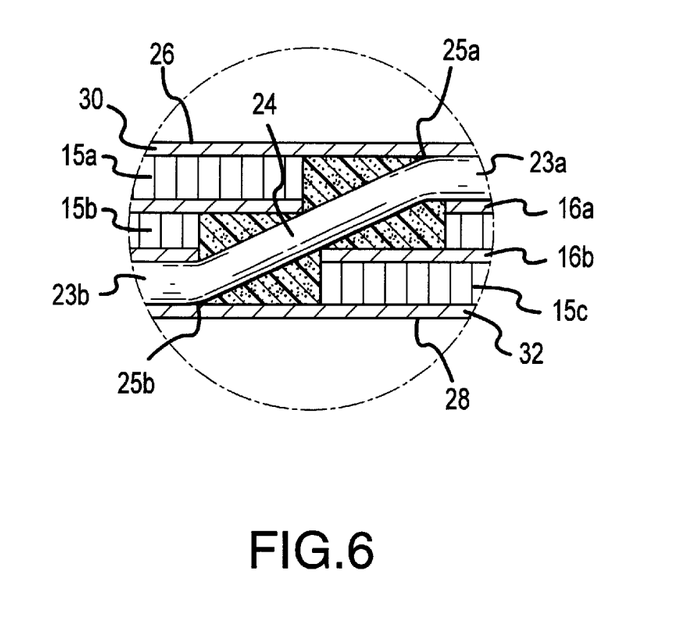
FIG. 6 is an enlarged view of the circled area 6 illustrated in FIG. 5.
Figure 7:
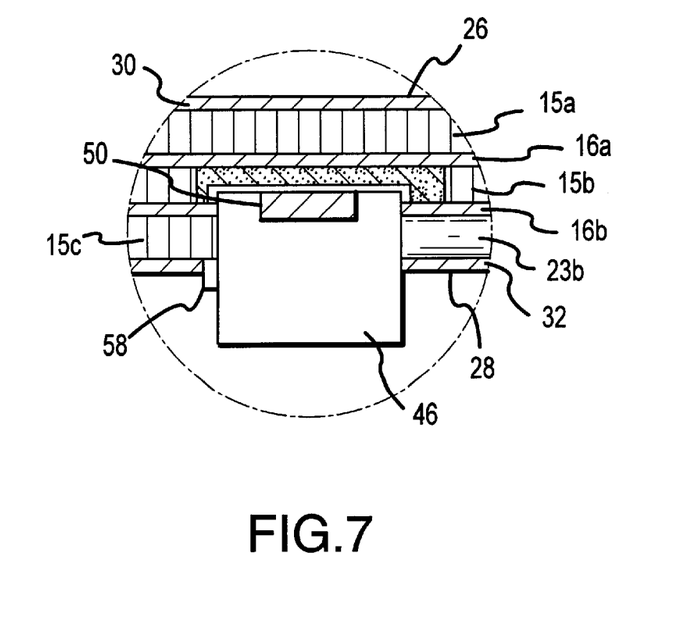
FIG. 7 is an enlarged view of the circled area 7 illustrated in FIG. 5.

As illustrated in FIGS. 5–7, for purposes of enabling the variable conductance heat pipes 22 to inhibit the transfer of heat energy from the inboard surface 26 to the outboard surface 28 of the structure 14, in this embodiment, each of the variable conductance heat pipes 22 includes a reservoir 46 of non-condensible gas which is in fluid connection with the outboard end portion 23b of the variable conductance heat pipes 22. Each of the variable conductance heat pipes 22 further includes a reservoir heater 50 interconnected to the reservoir 46. Such reservoir heaters 50 function to vary the volume of the gas contained with the reservoir 46, such that when the reservoir heaters 50 are activated to warm the reservoir 46 and the gas contained therein, the non-condensible gas (e.g. nitrogen, helium, neon and/or a combination thereof) expands to a point where heat flow to the outboard end portion 23b and thereby to the outboard surface 28 of the structure 14 is minimized or inhibited. In the second mode of operation, a reservoir heater 50 is activated such that the non-condensible gas forms a front which restricts or inhibits the flow of heat energy into the second end portion 23b of the variable conductance heat pipe 22. Such reservoir heaters 50 are activatable during conditions where it is not desirable to dissipate heat energy from the heat sources 18 (e.g., electronic equipment) toward the outboard surface 28 of the structure 14 of the spacecraft (e.g., to maintain the electronic equipment substantially at room temperatures during operation of the electronic equipment). It should also be noted that the variable conductance heat pipes 22 also function as constant conductance heat pipes when the reservoir heaters 50 are not activated to heat the non-condensible gas contained therein. In this regard, the variable conductance heat pipes 22 function to transfer heat energy from the inboard surface 26 to the outboard surface 28 of the structure 14 when it is desirable to dissipate heat from the electronic equipment 18 mounted on the inboard surface 26 of the honeycomb structure 14 (e.g., in the first mode of operation of the system 10 of the present invention). In this embodiment, the variable conductance heat pipes 22 include aluminum extrusions with an axially grooved hole running along its length. The variable conductance heat pipes 22 are charged with ammonia or other like working fluids and sealed. The ammonia contained therein is vaporizable at the inboard end portions 23a of the variable conductance heat pipes 22, which are thermally coupled to the first plurality of constant conductance heat pipes 38 and to at least some of the electronic equipment 18. When vaporized at the inboard end portions 23a of the variable conductance heat pipes 22, the ammonia gas travels along the center of the variable conductance heat pipes 22, to the outboard end portion 23b of the variable conductance heat pipe 22, where it is condensible. The liquid ammonia may then travel along the grooves back to the inboard end portions 23a to again pick up heat and vaporize, continuing the cycle, in order to transfer heat energy away from the heat sources 18 (e.g., electronic equipment).

In this embodiment, it is desirable to maintain the heat sources 18 (e.g., electronic equipment) operating substantially at room temperatures to optimize performance of the electronic equipment 18 (e.g., during high and low duty-cycles). In this regard, in a preferred embodiment, the thermal control system 10 of the present invention functions to keep the electronic equipment 18 operating between about 10° Celsius and about 40° Celsius. In another preferred embodiment, the thermal control system 10 functions to keep the electronic equipment 18 operating between about 15° Celsius and about 29° Celsius. The system may be designed to maintain the heat sources within other desirable ranges, depending upon the nature of the heat sources and the performance limits of the working fluid and of the support structure, as well as the open/close setting of the temperature sensors. In order to maintain the electronic equipment 18 at such room temperatures throughout various operating environments and duty-cycles, the thermal control system 10 further includes a plurality of sensors 34 (illustrated in FIG. 1) which are mounted on the inboard surface 26 of the structure 14 and/or thermally coupled to the variable conductance heat pipes 22 (e.g., inboard end portions 23*a* thereof) and to the first plurality of constant conductance heat pipes 38. In this regard, the temperature sensors 34 function to sense the temperatures of the inboard end portions 23*a* of the variable conductance heat pipes 22 which are thermally coupled to some of the electronic equipment 18 (e.g., heat sources) positioned thereover and of the first plurality of constant conductance heat pipes 38 which are thermally coupled to the same or other electronic equipment 18. Such temperature sensors may comprise thermostats and/or thermistors in electrical communication with a processor. Thermally coupling the temperature sensors 34 to the inboard end portions 23*a* of the variable conductance heat pipes 22 and the first plurality of constant conductance heat pipes 38 provides an average temperature of the gas contained within the heat pipes, which is directly correlatable to the temperature at which the electronic equipment 18 is operating (e.g., within a few degrees). As such, in the first mode of operation, where it is desirable to dissipate as much heat energy from the electronic equipment 18 as possible (e.g., during high duty-cycles), the temperature sensors 34, which open and close at pre-defined temperatures, are in an open state which corresponds to the reservoir heaters 50 of the variable conductance heat pipes 22 being deactivated (e.g., turned off). In the second mode of operation, where it is desirable to minimize or limit the transfer of heat energy to the outboard surface 28 of the structure 14, the temperature sensors 34 are capable of sensing lower temperatures. In such instances, the temperature sensors 34 are in a closed state, which causes power to be supplied to the variable conductance heat pipe reservoir heaters 50 and thus to the noncondensible gas contained within the reservoirs 46 to minimize the transfer of heat energy toward the outboard surface 28 of the structure 14. In this regard, the temperature sensors 34 are in electrical communication with the reservoir heaters 50 to thereby maintain the temperature of the electronic equipment 18 substantially at room temperatures. In this embodiment, whereby the system 10 is designed to maintain the temperature of the electronic equipment 18 operating substantially at the room temperature range(s) noted hereinabove, the thermostats 34 are adapted to control the variable conductance heat pipes 22 to open or close at about 20° Celsius to about 22° Celsius. Of course the systems can be adapted to maintain the temperature of the heat sources within other temperature ranges, depending upon the desired operating ranges of such heat sources. For example, some electric equipment may optionally operate at cooler temperatures (e.g., −20° Celsius).

As illustrated in FIGS. 1–6, the first and second plurality of constant conductance heat pipes 38,42 extend along the inboard and outboard portions of the structure 14, where such pipes are embedded within the structure 14. The first and second plurality of constant conductance heat pipes 38, 42 are thermally coupled to at least the inboard and outboard facesheets 30, 32 via a thermally conductive adhesive.

Further, the first plurality of constant conductance heat pipes 38 are thermally coupled to at least some of the electronic equipment 18. In this embodiment, the first plurality of constant conductance heat pipes 38 are at least positioned in areas of the structure 14 corresponding to thermal footprints of electronic equipment 18 which may not be thermally coupled to the inboard end portions 23*a* of the variable conductance heat pipes 22. Of course, and especially in instances where a particular electronic equipment has a high watt density, one or more of the first plurality of constant conductance heat pipes 38 and variable conductance heat pipes 22 may be positioned proximate the thermal footprint of such electronic equipment and thermally coupled thereto. In addition, for purposes of facilitating the transfer of heat energy from the electronic equipment 18 to the inboard end portions 23*a* of the variable conductance heat pipes 22, and then to the outboard surface 28 of the structure 14 in the first mode of operation, the first plurality of constant conductance heat pipes 38 are thermally coupled to inboard end portions 23*a* of the variable conductance heat pipes 22 (e.g., via a thermally conductive adhesive). As such, heat energy generated by the electronic equipment 18 is transferrable to the inboard end portions 23*a* of the variable conductance heat pipes 22 either directly or indirectly. Such an arrangement functions to provide an isothermal structure as heat energy is distributable about the inboard portion of the structure 14. The second plurality of constant conductance heat pipes 42, which are thermally coupled to the outboard end portions 23*b* of the variable conductance heat pipes 22, function to distribute heat energy about the outboard surface 28 of the structure 14 (e.g., about the outboard facesheet 32) to distribute such heat energy about the outboard surface 28 for radiative dissipation to the environment (e.g., space) in the first mode of operation. As evident in FIG. 4, certain constant conductance heat pipes of the first and second pluralities of constant conductance heat pipes 38, 42 may be configured (e.g., bent laterally) to accommodate ring assemblies 54 which are mounted in the structure 14 and which function to interconnect other equipment to the structure 14. Such constant conductance heat pipes (in an unbent configuration) are commercially available from various suppliers, such as Dynatherm, and are bent in accordance with conventional bending techniques.

In order to maintain the electronic equipment 18 operating substantially at room temperatures, rather than functioning solely to dissipate heat energy, the structure 14 of the present invention functions to inhibit or limit the transfer of heat energy through the thickness of the structure 14. In this regard, the structure 14 of the present invention is insulative in nature. In this embodiment, and as illustrated in FIGS. 5–7, the structure 14 is a honeycomb structure having first, second and third layers 15*a*, 15*b*, 15*c* of a composite honeycomb and first and second separator sheets 16*a*, 16*b* positioned between the first and second, and second and third honeycombs 15*a*, 15*b*, 15*c*, respectively. In addition, the honeycomb structure 14 includes the inboard and outboard facesheets 30, 32 which are bonded (e.g. via moisture insensitive thermally conductive adhesive, such as FM94M from Cytec Industries, Inc.) to the first and third honeycombs 15*a*, 15*c*. The first and second plurality of constant conductance heat pipes 38, 42, and the inboard and outboard end portions 23*a*, 23*b* of the variable conductance heat pipes 22 are embedded within channels or slots of the first and third honeycombs 15*a*, 15*b*, 15*c*, respectively, while the intermediate portions 24 of the variable conductance heat pipes 22 extend through openings in the second honeycomb 15*b*. In order to limit the transfer of heat energy through the thickness of the honeycomb structure 14 while adequately supporting the electronic equipment 18 mounted thereon, the first, second and third honeycombs 15a, 15b, 15c are fabricated from a strong, lightweight, composite material having a low thermal conductivity, such as NOMEX®, which is commercially available from DuPont. The first and second separator sheets 16a, 16b, which function to limit radiative heat transfer from the electronic equipment 18 toward the outboard facesheet 32, are fabricated from a lightweight material, having a low radiative heat transfer coefficient, such as aluminum. For purposes of further reducing the heat transfer through the thickness of the honeycomb structure 14, the cells of the first, second and/or third honeycombs 15a, 15b, 15c are vented to avoid having air trapped within each of the cells of the honeycombs since air may function to transfer heat energy. The honeycomb structure 14 is thus a sandwich construction of three layers of NOMEX® honeycomb, and bonded between the layers of NOMEX® honeycomb are the thin (e.g, 0.010 inch thick) aluminum separator sheets 16a, 16b, while the inboard and outer facesheets 30, 32 are fabricated from a lightweight material, such as aluminum, and are bondable to the outer surfaces of the sandwich. In this embodiment, the inboard and outboard facesheets 30, 32 are 0.020 inch thick.

For purposes of preserving the functionality of the electronic equipment 18 in extreme environments, such as extreme cold temperatures (e.g., less than −20° Celsius), the thermal control system 10 of the present invention further includes a plurality of supplemental heaters 58. Activation of the supplemental heaters 58 is especially useful when the electronic equipment 18 is operating at a low duty-cycle or is not operating (e.g., turned off). In this regard, the plurality of temperature sensors 34 are capable of sensing such extremely low temperatures and are adapted to be in a closed state at such temperatures. In such a closed state, power is suppliable to the reservoir heaters 50 of the variable conductance heat pipes 22 and to the supplemental heaters 58 mounted on the inboard facesheet 30 of the honeycomb structure 14 to inhibit the transfer of heat energy from the inboard surface 26 of the structure to the outboard surface 28 of the structure 14, and to provide heat energy to the electronic equipment 18 to preserve the functionality of such electronic equipment 18. More specifically, the supplemental heaters 58 are thermally coupled to at least some of the first plurality of constant conductance heat pipes 38 so that heat energy may be transferred from the supplemental heaters 58 to the electronic equipment 18 about the inboard facesheet 26 of the honeycomb structure 14 to thereby supply heat energy the electronic equipment 18 to keep such electronic equipment above −20° Celsius. Advantageously, due to the insulative nature of the composite honeycomb structure 14, substantially less power is required to power the supplemental heaters 58 to supply heat energy to the electronic equipment 18. Additionally, in this embodiment, an aluminum plate is interposed and installed between each supplemental heater 58 and the inboard facesheet 30 of the honeycomb structure 14 to provide a more uniform transfer of heat energy into the inboard facesheet 30 and/or into the first plurality of constant conductance heat pipes 38, and to inhibit the supplemental heaters 58, especially the outer edges of the supplemental heaters 58, from overheating.

In another aspect, the present invention is directed to a method for maintaining at least a first heat source (e.g., electronic equipment) on a spacecraft operating substantially within a desired temperature range (e.g., at room temperatures), regardless of whether the heat source is operating in a high-duty cycle or in a low-duty cycle, and for preserving the functionality of the first heat source in extreme cold environments, when the electronic equipment is not operating (e.g., turned off). In particular, and referring to FIG. 7, the present invention is directed to a method (110) for controlling the temperature of at least the electronic equipment mounted on the inboard facesheet of the honeycomb structure by monitoring the temperature of at least the electronic equipment, and performing (118) at least one of first and second steps in first and second modes of operation, respectively. In the first mode of operation, the first step includes the step of transferring (122) heat energy away from the electronic equipment when the electronic equipment is at a temperature greater than a first temperature (e.g. 22° C.). In the second mode of operation, the second step includes the step of inhibiting (130) the transfer of heat energy from the electronic equipment to the second or outboard surface of the honeycomb structure when the electronic equipment is at a second temperature (e.g., 20° C.) which is less than or equal to the first temperature. Most specifically, the step of monitoring (114) includes the step of sensing the temperature of at least a first heat pipe (e.g., an inboard end portion of a variable conductance heat pipe or one of a first plurality of constant conductance heat pipes) embedded within the structure, just below the inboard facesheet of the honeycomb structure. In one embodiment, a temperature sensor (e.g. thermostat, thermistor, etc.) thermally coupled to the first heat pipe is utilized to perform the monitoring step. In this regard, the temperature sensors are designed to open and close at pre-defined temperatures, the open and closed states corresponding to performing the first and second steps, respectively.

Figure 8:
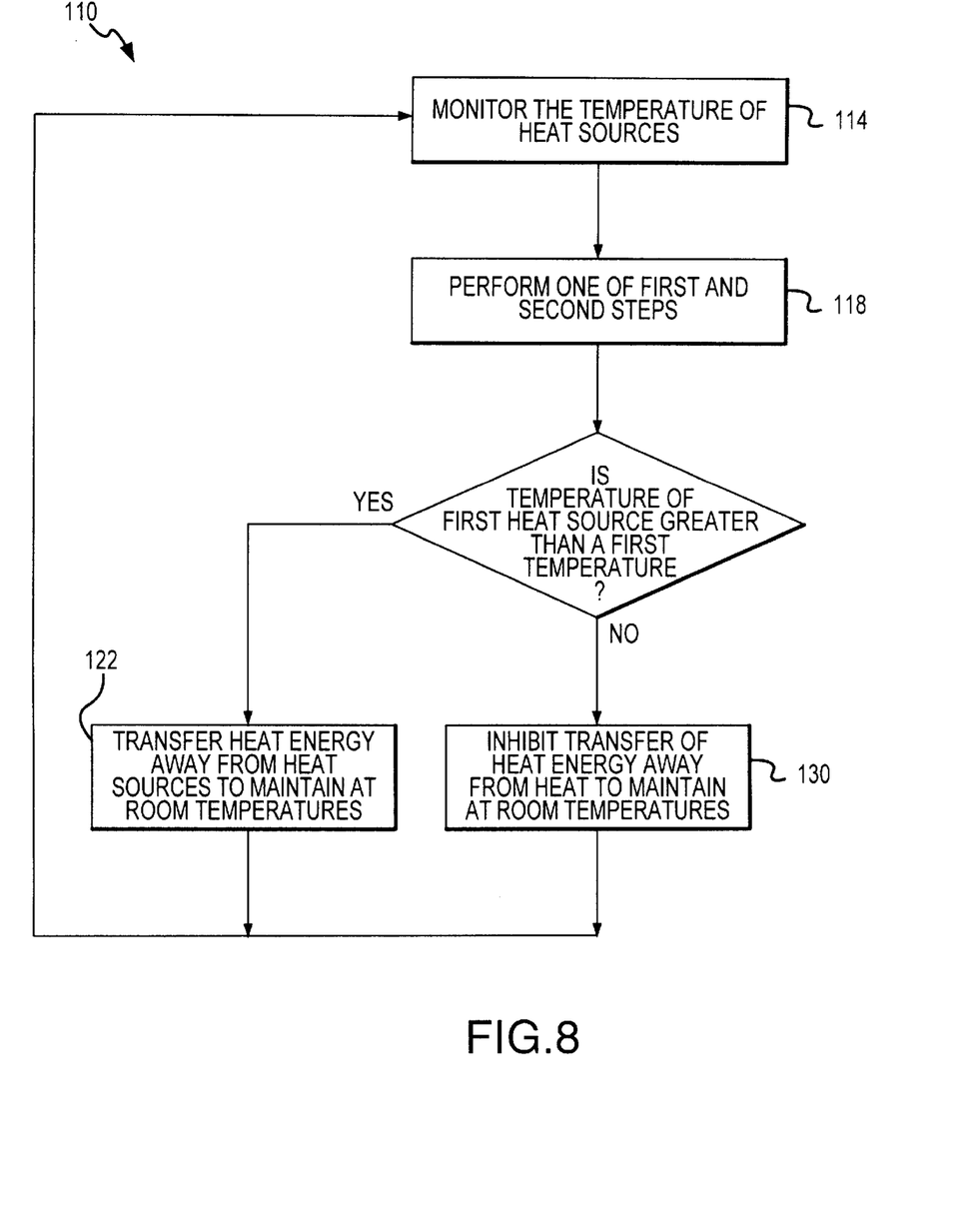
FIG. 8 is a flow chart illustrating one embodiment of the method of the present invention.
Figure 9:
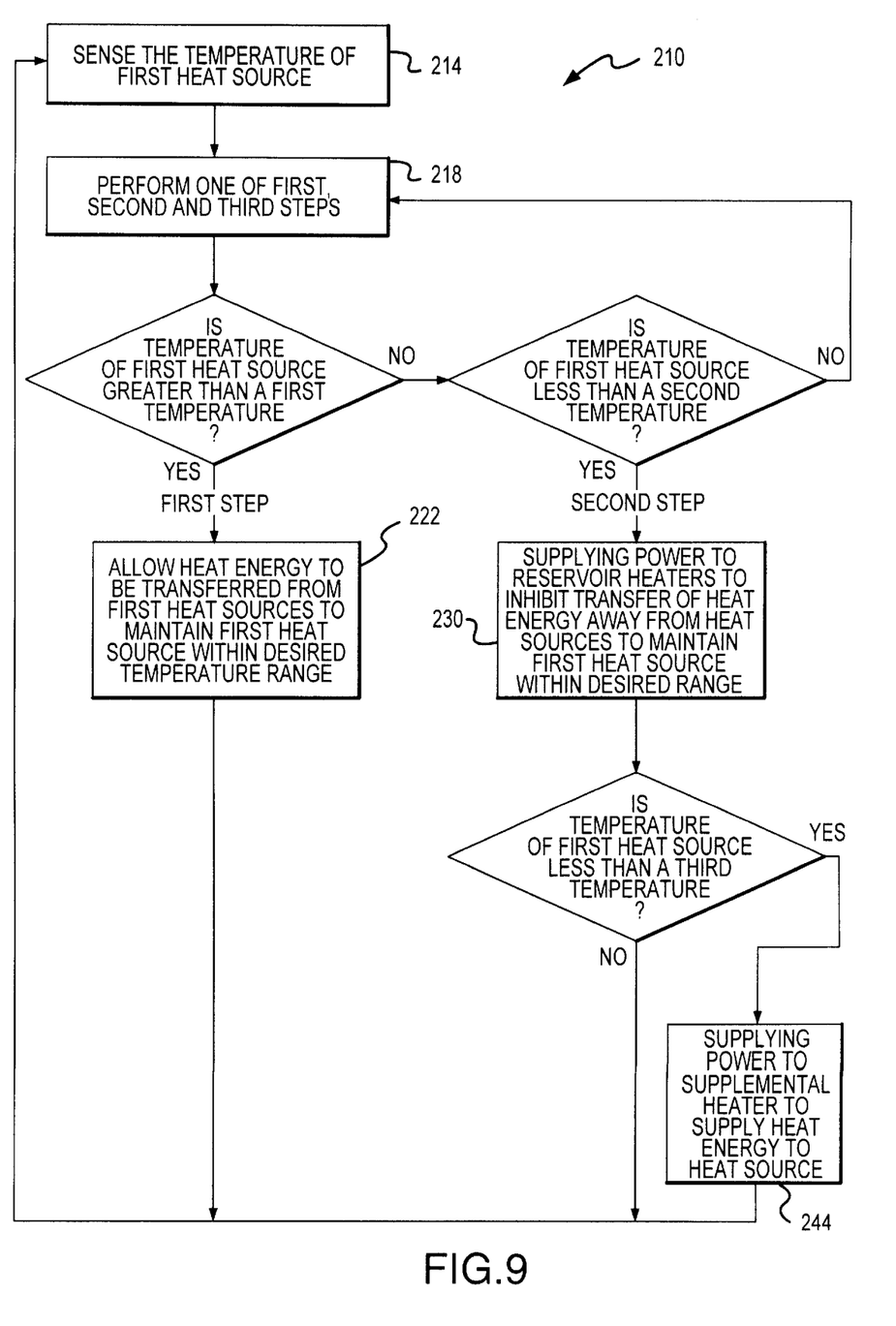
FIG. 9 is a flow chart illustrating another embodiment of the method of the present invention.

In instances where the temperature sensors are open, power is not supplied to the reservoir heater of a first variable conductance heat pipe embedded in the honeycomb structure, which allows heat energy to be transferred from the electronic system to the outboard facesheet of the structure to dissipate the heat to thereby maintain a temperature of the electronic equipment between about 10° Celsius and about 40° Celsius. In the second mode of operation, where the temperature sensed indicates a need to inhibit the transfer of heat energy from the electronic equipment in order to maintain the temperature of at least the first electronics equipment between about 10° Celsius and 40° Celsius, at least the first temperature sensor is in a closed state. In such a closed state, the transfer of heat energy from the electronic equipment to the outboard surface of the structure is inhibited. As such, and referring to FIG. 8, in this embodiment of the method 210, the second step (230) to inhibit the transfer of heat energy in the second mode of operation includes the step of applying heat to a first reservoir of a first variable conductance heat pipe embedded in the structure by supplying (230) power to a first reservoir heater associated with the first reservoir. More specifically, the inhibiting step includes the step of activating at least the first reservoir heater which is thermally coupled to the first reservoir of the first variable conductance heat pipe embedded in the structure to maintain the temperature of the electronic equipment substantially at room temperatures. As shown in FIG. 8, in this embodiment of the method, the method further includes the step of performing (218) a third step in a third mode of operation, the third step including the step of transferring heat energy to the electronic equipment to preserve the functionality of the electronic equipment in extreme environments. For example, in extreme cold environments the electronic equipment may not be operating (e.g., in an "off" state). In this embodiment, illustrated in FIG. 9, the step of sensing (214) the temperature of the electronic equipment includes sensing a third temperature from at least a first temperature sensor mounted on the structure (e.g., −20° Celsius or less). In such instances, and referring to FIG. 9, the third step includes the step of supplying (240) power to at least the first reservoir heater associated with the corresponding first variable conductance heat pipe embedded in the structure and supplying (244) power to a first supplemental heater interconnected to the inboard surface of the structure to supply heat energy to at least the electronic equipment. A constant conductance heat pipe and/or the inboard end portion of the first variable conductance heat pipe may be utilized to efficiently transfer heat energy from the first supplemental heater to the electronic equipment.

The foregoing description of the present invention has been presented for purposes of illustration and description. Furthermore, the description is not intended to limit the invention to the form disclosed herein. Consequently, variations and modifications commensurate with the above teachings, and the skill or knowledge of the relevant art, are within the scope of the present invention. The embodiments described hereinabove are further intended to explain the best modes known for practice in the invention and to enable others skilled in the art to utilize the invention in such, or other, embodiments and with various modifications required by the particular applications or uses of the present invention. It is intended that the appended claims be construed to include alternative embodiments to the extent permitted by the prior art.

What is claimed is:

1. A thermal management system comprising:
    a honeycomb structure for supporting at least a first heat source, said honeycomb structure having first and second surfaces defining a first thickness of said honeycomb structure, wherein said first heat source is interconnectable to said first surface; and
    at least a first heat pipe embedded within said honeycomb structure, said first heat pipe comprising a variable conductance heat pipe having first and second end portions locatable proximate said first and second surfaces of said honeycomb structure, respectively, said variable conductive heat pipe being adapted to transfer heat energy from at least said first heat source supported by said honeycomb structure toward said second surface of said honeycomb structure in a first mode of operation, and to inhibit the transfer of heat energy from said first heat source supported by said honeycomb structure to said second surface of said honeycomb structure in a second mode of operation, wherein said first and said second end portions are non-coplanar, such that said first end portion is vertically offset relative to said second end portion, said first and second end portions being embedded with said honeycomb structure, wherein an intermediate portion extending between said first and second end portions is embedded within said honeycomb structure.

2. A thermal management system as claimed in claim 1, wherein said intermediate portion is orientable between about 1 degree and about 180 degrees relative to at least one of the first and second end portions.

3. A thermal management system as claimed in claim 1, wherein said first heat pipe has a first diameter and includes at least a first bend portion between an intermediate portion and one of said first and second end portions of said first heat pipe, said first bend portion having a radius of at least about 10 times said first diameter.

4. A thermal management system as claimed in claim 1, wherein said variable conductance heat pipe includes a reservoir having a non-condensable gas contained therein, said reservoir being in fluid connection with said second end portion.

5. A thermal management system as claimed in claim 1, wherein said variable conductance heat pipe includes a reservoir containing a non-condensable gas, and a reservoir heater for supplying heat energy to said reservoir, said system further comprising:
    at least a first sensor for sensing the temperature of at least said variable conductance heat pipe, said first sensor being electrically interconnectable to said reservoir heater.

6. A thermal management system as claimed in claim 5, wherein said first temperature sensor comprises one of a first thermostat and a first thermistor, said first temperature sensor being adapted to supply power to said reservoir heater.

7. A thermal management system as claimed in claim 5, wherein said first temperature sensor includes one of a first thermostat and a thermistor for activating said reservoir heater during a second mode of operation corresponding to inhibiting transfer of heat energy from said first heat source to said second surface of said honeycomb structure via at least said variable conductance heat pipe.

8. A thermal management system as claimed in claim 5, wherein said first temperature sensor is adapted to activate said reservoir heater to inhibit the transfer of heat energy from at least said first heat source in a third mode of operation.

9. A thermal management system as claimed in claim 8, further comprising at least a first supplemental heater thermally couplable to a second heat pipe comprising a constant conductance heat pipe, wherein said first temperature sensor in electrical interconnection with said first supplemental heater and is adapted to activate said first supplemental heater to transfer heat energy from said first supplemental heater to at least said first heat source in said third mode of operation.

10. A thermal management system as claimed in claim 5, wherein said system is adapted to deactivate said reservoir heater in a first mode of operation to allow the transfer of heat energy from at least said first heat source toward said second surface of said honeycomb structure through said first thickness of said honeycomb structure via at least said variable conductance heat pipe, to activate said reservoir heater in a second mode of operation to inhibit the transfer of heat energy from at least said first heat source to said second surface of said honeycomb structure via at least said variable conductance heat pipe, and to activate said reservoir heater and a first supplemental heater interconnectable to said first surface in a third mode operation to inhibit the transfer of heat energy from at least said first heat source to said second surface of said honeycomb structure via at least said variable conductance heat pipe and to supple heat energy to at least said first heat source.

11. A thermal control system comprising:
    a honeycomb structure for at least supporting at least a first heat source, said honeycomb structure having first and second surfaces defining a first thickness of said honeycomb structure, wherein said first heat source is interconnectable to said first surface; and
    at least a first variable conductance heat pipe contained within said honeycomb structure for at least one of transferring heat energy from said first heat source supported by said honeycomb structure on said first surface toward said second surface, through said first thickness of said honeycomb structure, and inhibiting the transfer of heat energy from said first heat source on said first surface to said second surface, said first variable conductance heat pipe having first and second end portions locatable within said honeycomb structure, proximate said first and second surfaces of said honeycomb structure, respectively, wherein said first and second end portions are embedded within said honeycomb structure and are non-coplanar, such that said first end portion is vertically offset relative to said second end portion, within said honeycomb structure, wherein an intermediate portion of said first variable conductance heat pipe extending between said first and second end portions is embedded within said honeycomb structure.

12. A thermal control system as claimed in claim 11, wherein said honeycomb structure comprises an insulative member for inhibiting at one of radiative and conductive transfer of heat energy, said honeycomb structure being nonmetallic.

13. A thermal control system as claimed in claim 11, wherein said honeycomb structure comprises at least a first sheet interposable between first and second composite honeycomb cores for limiting at least radiative transfer of heat energy from said first surface towards said second surface of said honeycomb structure.

14. A thermal control system as claimed in claim 13, wherein at least a first portion of cells of at least one of first and second composite honeycomb cores is vented, said honeycomb structure having a heat transfer rate between said first and second surfaces of less than about 3 W/m$^{2°}$ C.

15. A thermal control system as claimed in claim 11, further comprising:
at least a first constant conductance heat pipe positionable proximate said first surface of said honeycomb structure for at least transferring heat energy from at least one of said first heat source and a second heat source to said first variable conductance heat pipe, said first constant conductance and first variable conductance heat pipes being thermally coupled.

16. A thermal control system as claimed in claim 11, further comprising:
at least a first constant conductance heat pipe positionable proximate said second surface of said honeycomb structure for at least transferring heat energy from said first variable conductance heat pipe, said first constant conductance and first variable conductance heat pipes being thermally coupled.

17. A thermal control system as claimed in claim 11, wherein at least said first variable conductance heat pipe includes a reservoir and a reservoir heater thermally coupled to said reservoir for heating a non-condensible gas contained within said reservoir, said system further comprising:
at least a first sensor adapted to at least monitor the temperature of at least one of said first heat source and said first surface of said honeycomb structure and activate said reservoir heater to inhibit the transfer of heat energy from said first surface to said second surface of said honeycomb structure via said first variable conductance heat pipe.

18. A thermal control system as claimed in claim 17, further comprising:
at least a first supplemental heater adapted to supply heat energy to at least the first heat source, wherein said first supplemental heater is activatable by said first sensor.

19. A thermal control system as claimed in claim 18, wherein said first supplemental heater is interconnectable to one of said first surface of said honeycomb structure and said first heat source, said system further comprising:
at least a first constant conductance heat pipe extending at least between said first supplemental heater and said first heat source, for at least transferring heat energy from said first supplemental heater to said first heat source.

20. A method for controlling the temperature of at least a first heat source interconnectable to a first surface of a honeycomb structure of a spacecraft, said method comprising the steps of:
monitoring the temperature of at least the first heat source; and
performing at least one of first and second steps in first and second modes of operation, respectively, wherein said first step includes the step of transferring heat energy away from the first heat source via a first variable conductance heat pipe embedded within the honeycomb structure, the first variable conductance heat pipe having first and second end portions and an intermediate portion extending therebetween embedded within said honeycomb structure, the first and second end portions being locatable proximate the first surface and the second surface of the honeycomb structure, respectively, wherein the first end portion is vertically offset relative to the second end portion within the honeycomb structure, the first heat source being at a temperature greater than a first temperature, wherein said second step includes the step of inhibiting the transfer of heat energy from the first heat source to the second surface of the honeycomb structure, the first heat source being at a temperature less than a second temperature, the second temperature being less than or equal to the first temperature.

21. A method as claimed in claim 20, wherein said monitoring step comprises the step of:
sensing the temperature of at least the first variable conductance heat pipe embedded in the honeycomb structure, wherein the first variable conductance heat pipe is thermally coupled to at least the first heat source.

22. A method as claimed in claim 20, wherein said inhibiting step in said second mode of operation comprises the step of applying heat to a first reservoir of the first variable conductance heat pipe embedded in the honeycomb structure to maintain the temperature of at least the first heat source within a first temperature range.

23. A method as claimed in claim 20, wherein said inhibiting step in said second mode of operation comprises the step of activating at least a first reservoir heater thermally coupled to a first reservoir of the first variable conductance heat pipe embedded in the honeycomb structure.

24. A method as claimed in claim 20, wherein said inhibiting step in said second mode of operation comprises the step of activating at least a first reservoir heater associated with the first variable conductance heat pipe embedded in the honeycomb structure to maintain the temperature of at least the first heat source within a first temperature range.

25. A method as claimed in claim 20, further comprising the step of:
performing a third step in a third mode of operation, said third step comprising the step of transferring heat energy to at least the first heat source, the first heat source having a third temperature below or equal to the second temperature.

26. A method as claimed in claim 25, wherein said transferring heat energy to at least the first heat source step comprises the step of activating of at least one of a first reservoir heater associated with the first variable conductance heat pipe embedded in the honeycomb structure and at least a first supplemental heater interconnected to the honeycomb structure to raise the temperature of at least the first heat source.

27. A thermal control system comprising:
   a structure for at least supporting at least a first heat source, said structure having first and second surfaces defining a first thickness of said structure, wherein said first heat source is interconnectable to said first surface, wherein said structure comprises at least a first sheet interposable between first and second composite honeycomb cores for limiting at least radiative transfer of heat energy from said first surface to second surface of said structure; and
   at least a first variable conductance heat pipe contained within the structure for at least one of transferring heat energy from said first surface toward said second surface and inhibiting the transfer of heat energy from said first surface to said second surface, said first variable conductance heat pipe having first and second end portions locatable proximate said first and second surfaces of said structure, respectively, wherein said first and second end portions are non-coplanar.

28. A thermal control system as claimed in claim 27, wherein at least a first portion of cells of at least one of first and second composite honeycomb cores is vented, said structure having a heat transfer rate between said first and second surfaces of less than about 3 $W/m^{2\circ}$ C.

29. A thermal control system comprising:
   a structure for supporting at least a first heat source, said structure having first and second surfaces defining a first thickness of said structure, wherein said first heat source is interconnectable to said first surface;
   at least a first variable conductance heat pipe contained within said structure for at least one of transferring heat energy from said first surface toward said second surface and inhibiting the transfer of heat energy of said first surface to said second surface, said first variable conductance heat pipe having first and second end portions locatable proximate said first and second surfaces of said structure, respectively, wherein first and second end portions are non-coplanar; and
   at least a first constant conductance heat pipe positionable proximate said first surface of said structure for at least transferring heat energy from at least one of said first heat source and second heat source to said first variable conductance heat pipe, said first constant conductance heat pipe and said first variable conductance heat pipe being thermally coupled.

30. A thermal control system, comprising:
   a structure for at least supporting at least a first heat source, said structure having first and second surfaces defining a first thickness of said structure, wherein said first heat source is interconnectable to said first surface;
   at least a first variable conductance heat pipe contained within said structure for at least one of transferring heat energy from said first surface toward said second surface and inhibiting the transfer of heat energy from said first surface to said second surface, said first variable conductance heat pipe having first and second end portions locatable proximate said first and second surfaces of said structure, respectively, wherein said first and second end portions are non-coplanar; and
   at least a first constant conductance heat pipe positionable proximate said second surface of said structure for at least transferring heat energy from said first variable conductance heat pipe, said first conductance heat pipe and said first variable conductance heat pipe being thermally coupled.

31. A thermal control system, comprising:
   a structure for at least supporting at least a first heat source, said structure having first and second surfaces defining first thickness of said structure, wherein said first heat source is interconnectable to said first surface;
   at least a first variable conductance heat pipe contained within said structure for at least one of transferring heat energy from said first surface toward said second surface and inhibiting the transfer of heat energy from said first surface to said second surface, said first variable conductance heat pipe having first and second end portions locatable proximate said first and second surfaces of said structure, respectively, wherein said first and second end portions are non-coplanar, wherein at least said first conductance heat pipe includes a reservoir and a reservoir heater thermally coupled to said reservoir for heating a non-condensable gas contained within said reservoir;
   at least a first sensor adapted to at least monitor the temperature of at least one of said first heat source and said first surface of said structure and activate said reservoir heater to inhibit the transfer of heat energy from said first surface to said second surface of said structure via said first variable conductance heat pipe;
   at least a first supplemental heater adapted to supply heat energy to at least said first heat source, wherein said first supplemental heat source is activatable by first sensor, wherein said first supplemental heater is interconnectable to one of said first surface of said structure and first heat source; and
   at least a first constant conductance heat pipe extending at least between said first supplemental heater and said first heat source, for at least transferring heat energy from said first supplemental heater to said first heat source.

* * * * *